United States Patent
Redeker et al.

(10) Patent No.: US 6,797,074 B2
(45) Date of Patent: Sep. 28, 2004

(54) WAFER EDGE CLEANING METHOD AND APPARATUS

(75) Inventors: Fred C. Redeker, Fremont, CA (US); Brian J. Brown, Palo Alto, CA (US); Michael Sugarman, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/278,115

(22) Filed: Oct. 22, 2002

(65) Prior Publication Data

US 2003/0041879 A1 Mar. 6, 2003

Related U.S. Application Data

(62) Division of application No. 09/281,618, filed on Mar. 30, 1999, now Pat. No. 6,523,553.

(51) Int. Cl.⁷ ................................................ B08B 7/04
(52) U.S. Cl. .......................... 134/26; 134/27; 134/33; 134/36; 134/6; 134/902
(58) Field of Search .................... 134/61, 26, 63, 134/78, 79, 902, 1, 1.3, 6, 27, 32, 18, 33, 34, 36; 15/77, 102, 97.1, 88.3, 88.2

(56) References Cited

U.S. PATENT DOCUMENTS

| | | | |
|---|---|---|---|
| 3,853,643 A | 12/1974 | Verleur | |
| 4,027,686 A | 6/1977 | Shortes et al. | |
| 4,897,369 A | 1/1990 | Beretta et al. | |
| 5,128,281 A | * 7/1992 | Dyer et al. | 438/693 |
| 5,608,943 A | 3/1997 | Konishi et al. | |
| 5,725,414 A | 3/1998 | Moinpour et al. | |
| 5,868,857 A | 2/1999 | Moinpour et al. | |
| 5,906,687 A | 5/1999 | Masui et al. | |
| 5,933,902 A | 8/1999 | Frey | |
| 6,055,694 A | 5/2000 | Steere | |
| 6,063,232 A | 5/2000 | Terasawa et al. | |
| 6,070,284 A | 6/2000 | Garcia et al. | |
| 6,523,553 B1 | * 2/2003 | Redeker et al. | 134/61 |

FOREIGN PATENT DOCUMENTS

| | | |
|---|---|---|
| EP | 0 475 435 B1 | 4/1994 |
| EP | 0 368 334 B1 | 3/1997 |
| EP | 0 544 131 B1 | 3/1997 |

OTHER PUBLICATIONS

Kem, Handbook of Semiconductor Wafer Cleaning Technology, Noyes Publications, pp. 134–142, 1993.*

* cited by examiner

Primary Examiner—Alexander Markoff
(74) Attorney, Agent, or Firm—Dugan & Dugan

(57) ABSTRACT

A method and apparatus is provided for removing material from the edge of a disk. In one embodiment, the edge of the disk is contacted with etchant via an etchant containing swab or trough (which may contain one or more transducers) and is rotated such that successive portions of the disk edge are scanned through the trough or past the swab. To prevent etchant from contacting the major surface of the substrate, and/or to prevent excessive etching, the edge of the disk is contacted with a rinsing fluid (e.g., a rinsing fluid nozzle or a trough filled with rinsing fluid). In a further embodiment material such as residue or particles may be removed via a trough containing sonically energized rinsing fluid.

15 Claims, 3 Drawing Sheets

WAFER EDGE CLEANING METHOD AND APPARATUS

This application is a division of U.S. patent application Ser. No. 09/281,618, filed Mar. 30, 1999, now U.S. Pat. No. 6,523,553, which is hereby incorporated by reference herein in its entirety.

FIELD OF THE INVENTION

The present invention relates generally to apparatuses and methods for cleaning thin discs, such as semiconductor wafers, compact disks, and the like. More particularly, the invention relates to removing material (such as processing residue or deposited material) from the edge of a thin disk.

BACKGROUND OF THE INVENTION

To manufacture a thin disk such as a semiconductor wafer, an elongated billet of semiconductor material is cut into very thin slices, about ½ mm in thickness. The slices or wafers of semiconductor material are then lapped and polished by a process that applies an abrasive slurry to the wafer's surfaces. Likewise, polishing processes are employed to planarize layers deposited on the wafer during device formation. After polishing, slurry residue is generally cleaned or scrubbed from the wafer surfaces via mechanical scrubbing devices, such as polyvinyl acetate (PVA) brushes, brushes made from other porous or sponge-like material, or brushes made with nylon bristles. Although these conventional cleaning devices remove a substantial portion of the slurry residue which adheres to the wafer edges, slurry particles nonetheless remain and may produce defects during subsequent processing.

In addition to slurry particles, other sources of edge residue/particles also exist. For example, during metal film deposition, a clamp ring typically is employed to secure a wafer to a heated pedestal within the deposition chamber and to shield wafer edges from film disposition (e.g., to prevent metal from depositing along wafer edges and shorting subsequently formed devices). Because the wafer and the clamp ring possess different coefficients of thermal expansion, each expands at a different rate during metal film deposition, the shear force between the clamp ring and the wafer's edge also may generate edge particles that serve as a defect source. Additionally, if the clamp ring surface does not make intimate contact with the wafer surface along the entire circumference of the wafer, or if the ring and wafer are not concentrically aligned, a portion of the wafer's edge may be exposed erroneously and coated with metal. Thereafter, processing steps are undertaken to pattern the wafer with semiconductor circuitry. Patterning, including selective doping through photoresist masks, deposition of blanket or selective thin film layers, and selective etching of materials, may deposit further residue particles on wafer edges, including ashed photo-resist, metals such as Cu, Ta, W, TaN, Ti, etc., material from non-metallic depositions, etc. Yet another source of potential contamination is the cassettes into which wafers are loaded for transport from one processing station to another. While the aforementioned mechanical means do remove some edge residue/particles, it is often difficult to remove all edge residue/particles, and subsequent processing has been shown to redistribute edge residue/particles to the front of the wafer, causing defects.

Co-pending U.S. patent application Ser. No. 09/113,447, having a filing date of Jul. 10, 1998 and assigned to the present assignee, entitled "Wafer Edge Scrubber", provides an improved scrubbing apparatus having a profiled surface to more effectively mechanically remove residue/particles from the wafer's edge. While highly effective for removal of residue, an additional edge cleaning apparatus for use in conjunction with the disclosed scrubbing apparatus would further reduce edge residue/particle levels. Moreover, the scrubbing apparatus of U.S. patent application Ser. No. 09/113,447 is not able to remove layers erroneously deposited on a wafer's edge.

Accordingly, the field of disk cleaning requires a method and apparatus which effectively removes both residue and deposited material from a disk's edge without adversely impacting the disk's major surfaces.

SUMMARY OF THE INVENTION

The present invention addresses the need for more effectively removing material from the edge of a disk by providing a method and apparatus for etching material layers and/or for cleaning residue from the edge of a disk. In a first aspect, an etchant is applied to the disk's edge via an absorbent swab into which a fluid supply line extends. The swab is placed in contact with the disk's edge and the etchant is supplied via the fluid supply line as the disk is rotated. Given the potential for the etchant to drip and thereby come into contact with patterned areas of the disk as the disk rotates away from the etchant supply (e.g., away from the swab), a rinsing fluid source (e.g., a trough or a nozzle) is positioned to remove the etchant from the disk's edge.

In a second aspect an etchant is supplied to the disk's edge via an etchant filled trough in which the edge of a vertically oriented disk is submerged. The trough may include a transducer which enhances material removal by imparting megasonic energy to the etchant. Thus, in the first and second embodiments, the invention uniformly etches material from the edge of the disk without the particle generation often experienced by the edge rings conventionally employed to prevent edge deposition.

In a third aspect, cleaning fluid is applied to the disk's edge via a cleaning fluid filled trough in which the edge of a vertically oriented disk is submerged. The trough includes transducers which enhance cleaning by imparting megasonic energy to the cleaning fluid. An optional swab may be positioned such that the disk's edge is contacted by the swab prior to reaching the trough or after leaving the trough. The swab loosens and/or removes particles which may be continuously flushed from the surface of the swab via a fluid supply line which extends into the swab.

Each aspect of the invention may be used alone, or with any other cleaning apparatus that rotates a vertically oriented disk. Particularly, to provide the combined cleaning of both scrubbing and megasonics in a single step, the inventive cleaning trough may be used with a vertically oriented scrubber such as that disclosed in commonly assigned U.S. patent application Ser. No. 09/113,447, filed Jul. 10, 1998, the entire disclosure of which is incorporated herein by this reference. Thus, the invention may be used to remove deposited material layers from disk edges and/or may provide superior edge cleaning by combining both scrubbing via the swab or via a vertical scrubber, and megasonic cleaning via the inventive trough. The invention is particularly well suited for removing material from semiconductor substrates (silicon or a processed substrate having layers thereon) and for removing material from electroplated disks. For instance, during copper electroplating, it is difficult to ensure that no copper is deposited on the edge of the wafer. Because the barrier layer deposited prior to copper electroplating often is of insufficient thickness or continuity at the wafer's edge, any copper deposited thereon can diffuse into the wafer via the edge, degrading the electrical performance of devices being fabricated on the wafer. The present invention allows for the complete removal of copper from the wafer's edge. Similarly, tungsten can be inadvertently deposited on the wafer's edge. Because the adhesion layer at the wafer's edge is often of insufficient thickness or continuity, tungsten deposited on the wafer's edge will often have poor adhesion. Due to poor adhesion, and also due to tungsten's high internal stress, the wafer's edge can be a source of tungsten particles which may fall upon the wafer surface during subsequent processing. The present invention allows for the complete removal of tungsten from the wafer edge.

Other objects, features and advantages of the present invention will become more fully apparent from the following detailed description of the preferred embodiments, the appended claims, and the accompanying drawings.

DETAILED DESCRIPTION OF THE PREFERRED EMBODIMENT

Figure 1:
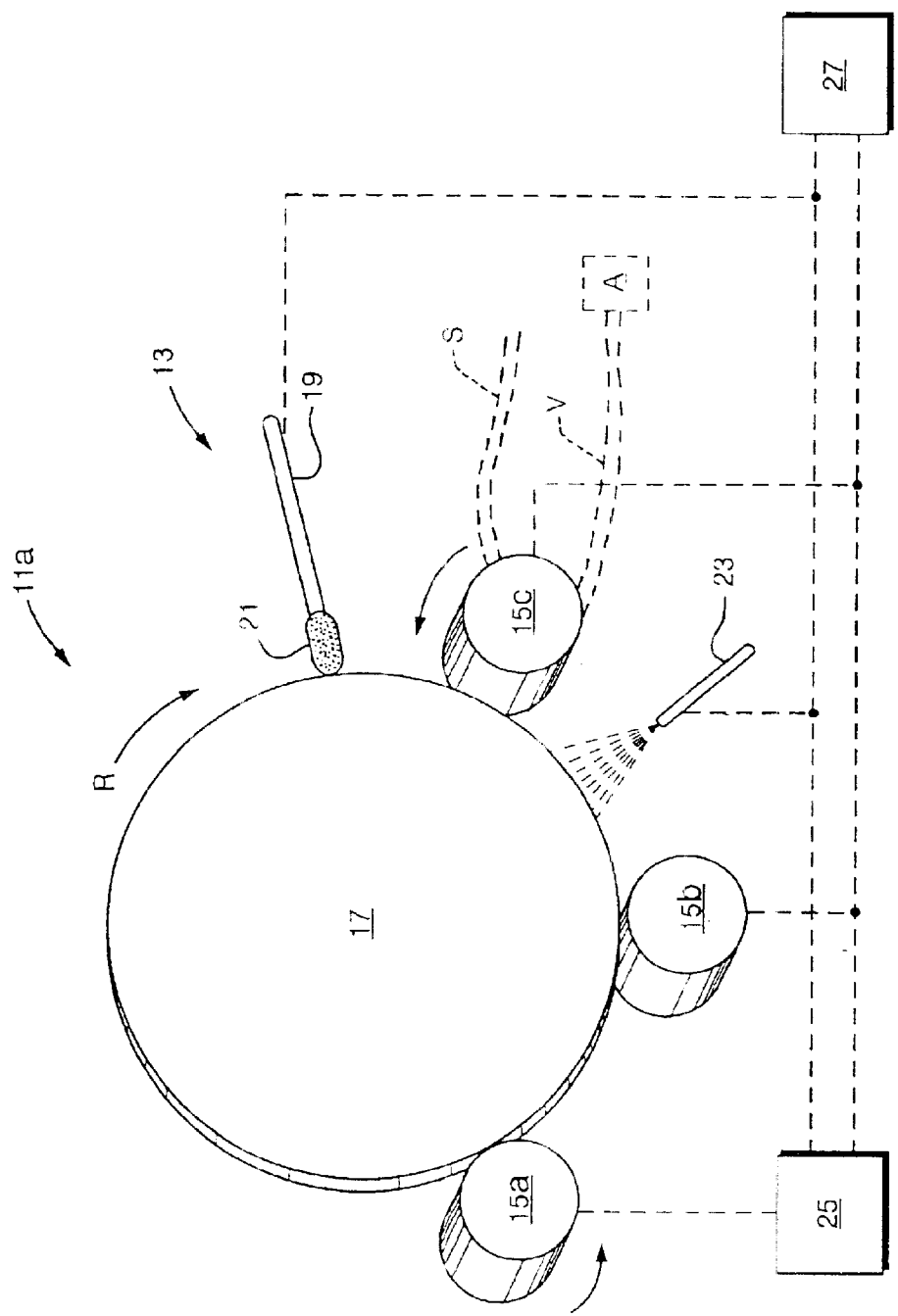
FIG. 1 is a side-perspective view of a first aspect of the invention which applies etchant via a swab.

FIG. 1 is a side view of a first aspect of an inventive system 11a which applies etchant via a swab 13. The inventive system 11a comprises a plurality of rollers 15a–c for supporting a disk, such as a semiconductor wafer 17, in a vertical orientation. The rollers 15a–c preferably have a v-shaped notch in which the semiconductor wafer 17 rides with minimal contact with the semiconductor wafer 17's major surface. The swab 13 comprises a liquid supply line such as a tube 19 having an absorbent material 21 mounted on the end thereof. Preferably the end of the tube 19 has a plurality of perforations the size and number of which are selected so as to maintain the absorbent material 21 at a desired level of saturation. The absorbent material 21 is made of a sponge-like material that can retain fluid (i.e., is absorbent), is wear resistant, so as to aid in material removal by mechanical abrasion, and elastic, so as to conform to the surface profile of the semiconductor wafer 17's edge.

The swab 13 is positioned to avoid the possibility of etchant dripping (e.g., due to gravity) onto the major surface of the semiconductor wafer 17. Thus, the tube 19 is preferably positioned along the lower half of the semiconductor wafer 17's edge. Similarly, a rinsing fluid stage, such as a rinsing nozzle 23, is positioned to rinse etchant from the semiconductor wafer 17 before the portion of the semiconductor wafer 17 having etchant thereon, rotates to a position where etchant may contact the major surface of the semiconductor wafer 17 (e.g., due to gravity). Thus the rinsing nozzle 23 is preferably positioned along the lower half of the semiconductor wafer 17's edge, and is preferably below the swab 13.

The rollers 15a–c are coupled to a motor 25 which causes the rollers 15a–b to rotate in a direction R. The motor 25, the swab 13 and the rinsing nozzle 23 are each operatively coupled to a controller 27 which controls the rotational speed of the rollers 15a–c, and the rate of fluid flow through the tube 19 and the rinsing nozzle 23.

In operation, the swab 13 is positioned so as to contact the semiconductor wafer 17 a fixed distance from its edge (e.g., 1–2 mm), and so as to contact the semiconductor wafer 17 with light pressure (e.g., <1 psi) so as to aid in material removal without causing the absorbent material 21 to wear at an unacceptable rate. The motor 25 is engaged and causes the rollers 15a–c and the semiconductor wafer 17 positioned thereon to rotate at a desired speed. The speed is selected so that etchant will remain in contact with the semiconductor wafer 17's edge long enough to etch a desired thickness of material therefrom, prior to encountering rinsing fluid from the rinsing nozzle 23. A supply of etchant specific to the material to be removed is operatively coupled to the tube 19 of the swab 13. For example, to remove silica slurry, a source of hydrofluoric acid is preferably employed, to remove copper a source of hydrochloric or nitric acid is preferably employed and to remove tungsten a source of ammonium hydroxide and hydrogen peroxide is preferable employed. However, any chemical which has a reasonable etch rate of the material to be removed (>100 Å/min.) could be used.

As the semiconductor wafer 17 rotates, etchant is supplied to the tube 19 and seeps through the perforations (not shown) into the absorbent material 21, and a rinsing fluid, such as deionized water, is supplied through the rinsing nozzle 23. The material (which the etchant is selected to etch) is etched as each area of the semiconductor wafer 17 rotates between the swab 13 and the rinsing nozzle 23. The abrasive contact between the absorbent material 21 and the semiconductor wafer 17 is also believed to facilitate material removal, as the spongy swab material necessarily has a slightly abrasive effect which assists the chemical etching process. The etchant, which is chosen to etch a specific material from the edge of the disk, is continuously injected to the swab.

Due to the fact that the etchant would also remove the specific material from the major surface of the semiconductor wafer 17, it is important to keep the etchant away from the wafer's major surface. One mechanism for removing and/or neutralizing the etchant is via the rinsing nozzle 23 which sprays fluid with a sufficient flow rate to rinse the etchant from the edge, or to otherwise neutralize the etchant. Thus the rinsing nozzle 23 prevents over etching. That is, the rinsing fluid nozzle prevents etchant from contacting the major surface of the semiconductor wafer 17 (e.g., via gravity or via centrifugal force) for a period of time sufficient to etch the disk's major surface, and/or to prevent excess etching along the disk's edge (e.g., etching of insulating layers or of the silicon substrate).

Another mechanism for removal of the etchant-contaminant chemistry is the roller immediately adjacent to the tube and swab, roller 15c of FIG. 1. The roller may be fabricated of an absorbent material, chosen to be inert to the etchant, and may additionally include a rinsing fluid source and/or a vacuum means for continual removal of the etchant-contaminant chemistry, as represented in phantom by the rinsing fluid supply line S, the vacuum line V and the fluid analyzer A. Yet another means for removal of the chemistry is to include a rinsing fluid trough, such as that shown at 31 of FIG. 2.

While the swab 13 is shown as positioned to contact a portion of the wafer's edge before that edge portion rotates onto the adjacent roller, and the rinsing nozzle 23 is positioned between the first and second rollers 15a, 15b, other positions are possible as long as the etchant-contaminant chemistry is removed before it etches semiconductor wafer 17's major surfaces. To accommodate different etchants, more than one etchant station (i.e., tube and swab station), may be included. Additional rinsing stations may be included as needed. If the etching is conducted after each stage of disk processing, a single etchant station should be sufficient. However, if all etching is to be conducted after final processing, multiple etching stations may be preferred.

Figure 2:
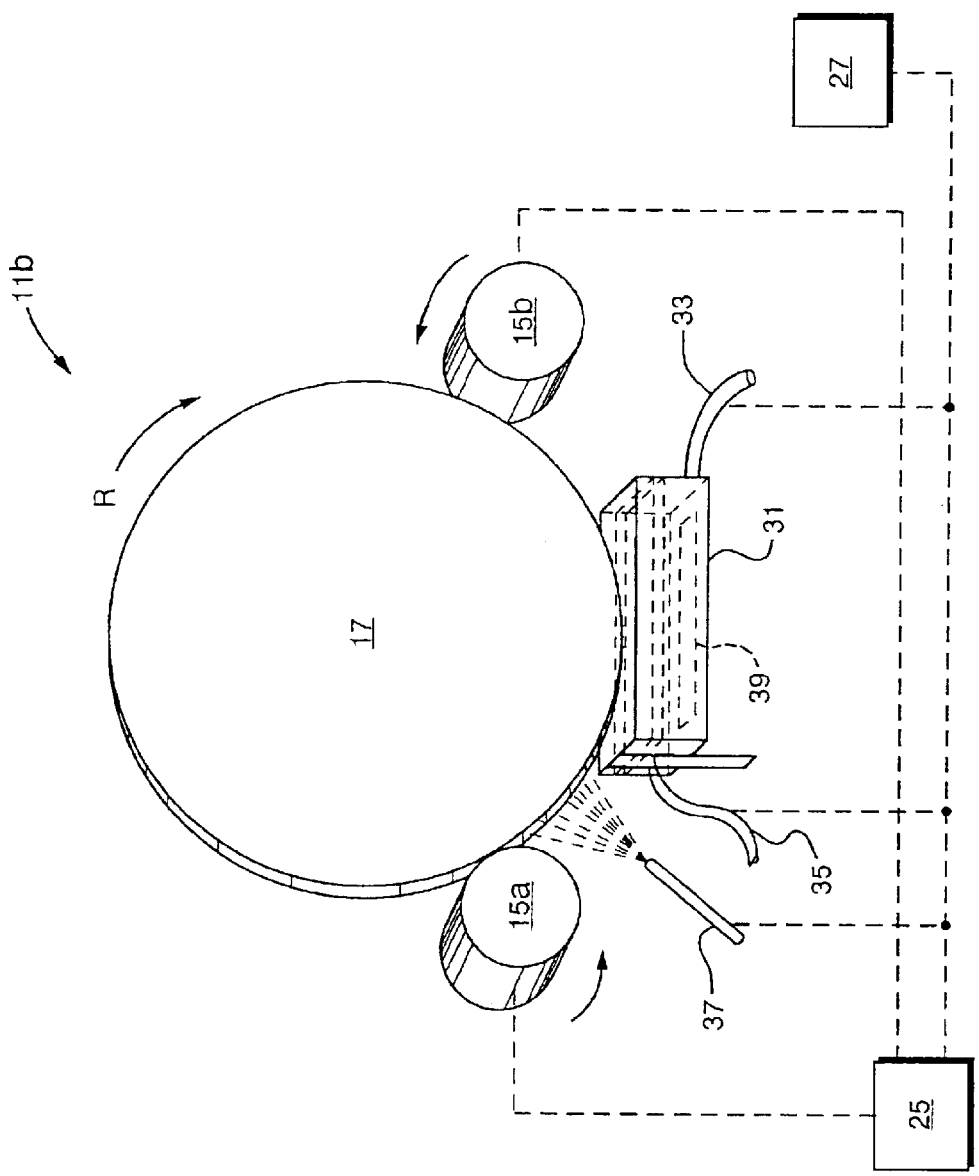
FIG. 2 is a side-perspective view of a second aspect of the invention which applies etchant via a trough.

FIG. 2 is a side view of a second aspect of the invention which applies etchant via a trough 31. The trough 31 is positioned between a pair of rollers 15a, 15b, like those of FIG. 1. An etchant supply line 33, and an etchant outlet line 35 are operatively coupled to the trough 31. Preferably, the etchant supply line 33 is coupled to the trough 31 at a position before the semiconductor wafer 17 enters the trough 31, and the etchant outlet line 35 is coupled to the trough 31 at a position after the semiconductor wafer 17 exits the trough 31. A rinsing fluid station, such as a rinsing fluid nozzle 37, is positioned to rinse etchant from the semiconductor wafer 17 before the portion of the semiconductor wafer 17 having etchant thereon, rotates to a position where etchant may contact the major surface of the semiconductor wafer 17 (e.g., due to gravity). Thus, the rinsing fluid nozzle 37 is preferably positioned along the lower half of the semiconductor wafer 17's edge, and along the side of the semiconductor wafer 17 which exits the trough 31. The trough 31 may also contain one or more optional transducers 39 position to direct sonic energy through the etchant to the edge of the semiconductor wafer 17.

Like the embodiment of FIG. 1, the rollers 15a–b are coupled to a motor 25 which causes the rollers 15a–b to rotate. The etchant supply line 33, the etchant outlet line 35, the rinsing fluid nozzle 37 and the motor 25 are each operatively coupled to a controller 27 which controls the rotational speed of the rollers 15a–b, and the rate of fluid flow through the etchant supply line 33, through the etchant outlet line 35 and through the rinsing fluid nozzle 37.

In operation, a semiconductor wafer 17 is positioned on the rollers is 15a–b, and a predetermined portion of the semiconductor wafer 17's edge thereby is submerged in the trough 31. The motor 25 is engaged and causes the rollers 15a–b and the semiconductor wafer 17 positioned thereon, to rotate at a desired speed in a direction R. The rotational speed is selected so that etchant will remain in contact with the semiconductor wafer 17's edge long enough to etch a desired thickness of material therefrom, prior to encountering rinsing fluid from the rinsing fluid nozzle 37. A supply (not shown) of etchant specific to the material to be removed is operatively coupled to the etchant supply line 33.

As the semiconductor wafer 17 rotates, etchant is supplied to the etchant supply line 33 and rinsing fluid such as deionized water is supplied through the rinsing fluid nozzle 37. Preferably, a continuous supply of etchant flows in the etchant supply line 33, through the trough 31 and out the etchant outlet line 35, so that material removed from the semiconductor wafer 17 does not accumulate in the trough 31 and deleteriously affect the etching process. Because some rinsing fluid may travel along the surface of the wafer to the trough 31, the etchant outlet line 35 is coupled to a drain (not shown) rather than recirculated. In order to maintain the etchant concentration in the trough 31 at a constant level, the rate at which etchant enters the trough 31 via the etchant supply line 31 is preferably at least equal to the rate at which rinsing fluid enters the trough 31. Thus, the material (which the etchant is selected to etch) is etched as each area of the semiconductor wafer 17 rotates between the trough 31 and the rinsing fluid nozzle 37.

As the semiconductor wafer 17's edge emerges from the etchant in the trough 31, the semiconductor wafer 17's edge is rinsed via the rinsing fluid nozzle 37, to prevent any remaining etchant from dripping onto the semiconductor wafer 17's major surface, and to neutralize and/or rinse away any remainder of the etchant material. Similar to the tube and swab arrangement described with reference to FIG. 1, different etchants may be sequentially flowed through the trough 31, to specifically etch several layers of deposited material. The optional transducers 39 may be energized to further enhance material removal, as further described with reference to a third aspect of the cleaning system shown in FIG. 3.

Figure 3:
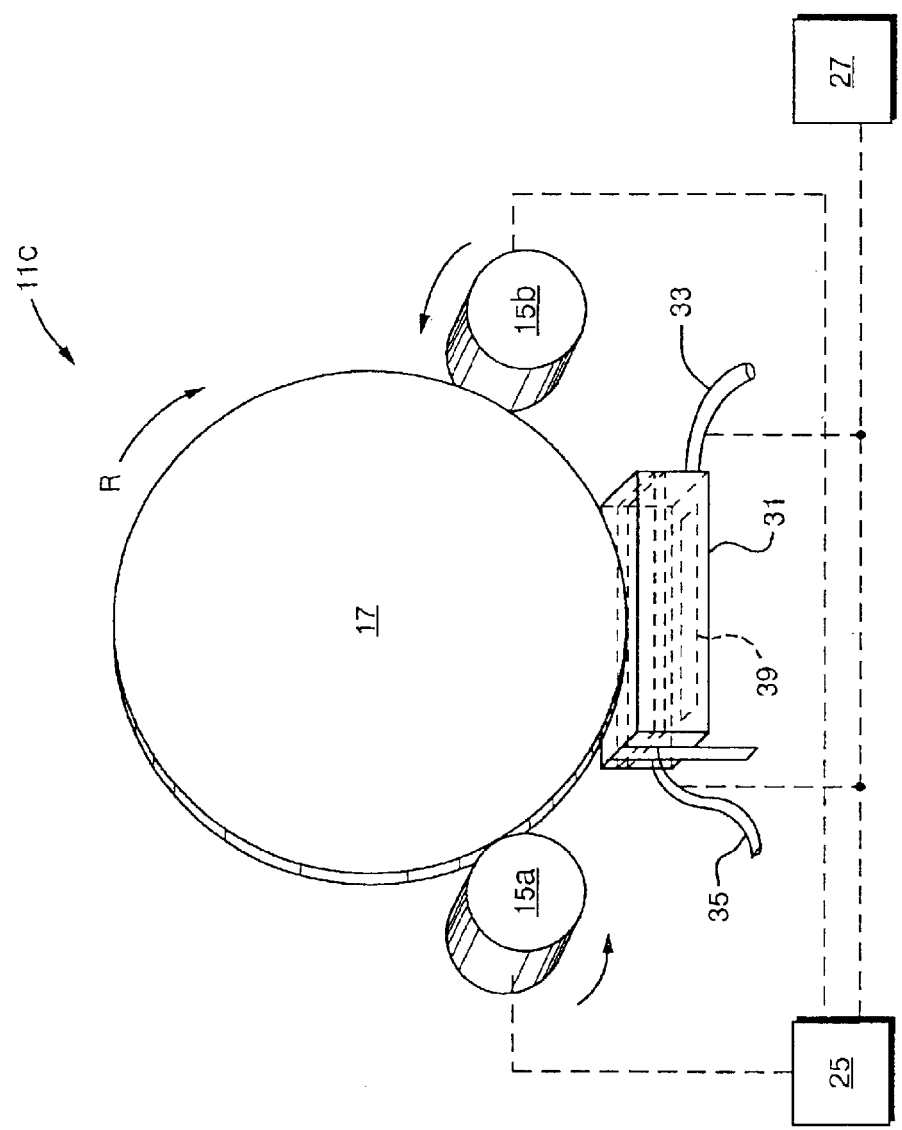
FIG. 3 is a side-perspective view of a third aspect of the invention which applies cleaning fluid via a megasonic trough such as the trough of FIG. 2.

FIG. 3 is a side view of a third aspect of an inventive system 11c which applies cleaning fluid via a trough such as the trough 31 of FIG. 2. The inventive system 11c is configured like the inventive system 11b of FIG. 2, except that the trough 31 itself is filled with cleaning fluid, and the rinsing fluid nozzle 37 is therefore omitted. Additionally, the transducers 39 optionally contained within the trough 31 of FIG. 2, are required in the inventive system 11c of FIG. 3. Because the inventive system 11b and inventive system 11c are otherwise identical, description of the specific components are not repeated.

In operation the transducers 39 are energized, and the motor 25 is engaged and causes the rollers 15a–b, and the semiconductor wafer 17 positioned thereon, to rotate at a desired speed in a direction R. The speed is selected so that the semiconductor wafer 17 remains in contact with the trough 31's sonically energized cleaning fluid long enough to remove the undesirable material from the semiconductor wafer 17's edge.

As is well known, energizing the transducer 39 by applying an oscillating voltage thereto, causes the transducer 39 to expand and contract. The transducer 39's expansion and contraction causes cavitations or bubbles within the cleaning fluid. The bubbles expand and contract, thereby gently scrubbing the surface of the semiconductor wafer 17. The frequency at which the transducer 39 oscillates maximizes particle removal efficiency but does not damage the semiconductor wafer 17, e.g., 500 kHz to 2 MHz. Due to a known effect, the megasonic power density increases at the air/liquid interface as the semiconductor wafer 17 is dragged through the air/liquid interface. Therefore, as the semiconductor wafer 17 is rotated through the trough 31, the cleaning fluid air/liquid interface scans the circumference of the semiconductor wafer 17 and removes material (e.g., slurry particles, cassette residue, ashed photo resist, etc.) therefrom.

Preferably the cleaning fluid is deionized water or another such liquid which maximizes the electrostatic repulsion between the material to be removed and the semiconductor wafer 17. For example, to remove silica slurry from a disk having a negative charge (e.g., a silicon oxide coated wafer), a preferred cleaning fluid liquid is dilute NH4OH with $H_2O_2$.

The foregoing description discloses only the preferred embodiments of the invention, modifications of the above disclosed apparatus and method which fall within the scope of the invention will be readily apparent to those of ordinary skill in the art. For instance, the swab pictured herein is merely exemplary; other shapes may be employed, such as a curved swab shaped to contact an elongated portion of the substrate's circumference and/or to contact both surfaces of the disk. Likewise, although the trough pictured herein is preferred as it is shallow and therefore conserves rinsing fluid, other trough configurations may be employed. The disk may be supported by mechanisms other than the rollers disclosed, and the motor and the rotateable rollers which scan the disk past the etchant and rinsing fluid stations may be replaced with a stationary disk support, and a motorized etchant and rinsing fluid station which scan the disk's edge. Thus, as used herein, scanning the etchant or rinsing fluid station relative to the thin disk, encompasses moving the disk and/or the respective station. Although not shown, other disk orientations (e.g., horizontal) may be employed. The swab and trough are preferred etchant stations; however, other less preferred embodiments will fall within the scope of the invention. For instance, a capillary tube may be positioned sufficiently close to the disk's edge, and the flow rate of etchant through the capillary, and the rotational speed of the disk can be adjusted so that a meniscus of etching fluid forms on the edge of the disk. The meniscus will maintain etchant on the disk's edge and prevent etchant from flowing onto the disk's major surface. Finally, it will be understood that the trough or swab may be positioned so as to remove material from any desired region of the disk's edge (e.g., any distance from the disk's edge).

Accordingly, while the present invention has been disclosed in connection with the preferred embodiments thereof, it should be understood that other embodiments may fall within the spirit and scope of the invention, as defined by the following claims.

The invention claimed is:

1. A method of removing material from the edge of a disk, comprising:
   supporting a disk in a vertical orientation;
   supplying an etchant to an edge of the vertically oriented disk;
   supplying a rinsing fluid to the edge of the vertically oriented disk so as to rinse the etchant therefrom and thereby prevent over etching; and
   rotating the vertically oriented disk while supplying the etchant and the rinsing fluid to the edge of the disk
   wherein the rinsing fluid is supplied to the edge of the vertically oriented disk so as to rinse the etchant from the edge of the vertically oriented disk before the etchant contacts a major surface of the vertically oriented disk for a period of time sufficient to etch the major surface of the vertically oriented disk as the vertically oriented disk is rotated.

2. The method of claim 1 wherein supplying etchant to the edge of the vertically oriented disk comprises contacting the edge of the disk with and absorbent swab, and supplying the absorbent swab with etchant.

3. The method of claim 1 wherein supplying the rinsing fluid to the edge of the disk comprises spraying rinsing fluid.

4. The method of claim 1 wherein supplying the rinsing fluid to the edge of the disk comprises rotating the vertically oriented disk through a trough of rinsing fluid.

5. The method of claim 4 further comprising flowing rinsing fluid through the trough.

6. The method of claim 4 further comprising sonically energizing the rinsing fluid contained in the trough.

7. The method of claim 1 wherein supplying etchant to the edge of the vertically oriented disk comprises rotating the edge of the disk through a trough of etchant.

8. The method of claim 7 further comprising sonically energizing the etchant contained in the trough.

9. The method of claim 1 wherein supplying an etchant to the edge of the disk comprises supplying etchant to a lower half of the disk's edge.

10. The method of claim 1 wherein supplying a rinsing fluid to the edge of the disk comprises supplying etchant to a lower half of the disk's edge.

11. The method of claim 1 wherein supporting the disk in the vertical orientation comprises supporting the disk on at least one roller; and wherein supplying rinsing fluid to the edge of the disk comprises supplying rinsing fluid through the at least one roller.

12. The method of claim 11 further comprising vacuuming fluid from the at least one roller.

13. The method of claim 12 further comprising analyzing the fluid vacuumed from the at least one roller.

14. A method of removing material from the edge of a disk, comprising:
    supporting a disk in a vertical orientation;
    supplying an etchant to an edge of the vertically oriented disk;
    supplying a rinsing fluid to the edge of the vertically oriented disk so as to rinse the etchant therefrom and thereby prevent over etching;
    rotating the vertically oriented disk while supplying the etchant and the rinsing fluid to the edge of the disk;
    wherein supporting the disk in the vertical orientation comprises supporting the disk on at least one roller; and wherein supplying rinsing fluid to the edge of the disk comprises supplying rinsing fluid through the at least one roller; and
    vacuuming fluid from the at least one roller.

15. The method of claim 14 further comprising analyzing the fluid vacuumed from the at least one roller.

* * * * *